United States Patent [19]

Inahasi

[11] Patent Number: 5,898,337

[45] Date of Patent: Apr. 27, 1999

[54] OUTPUT SIGNAL LEVEL CONTROL CIRCUIT USING DIFFERENT DETECTING SECTIONS IN DIFFERENT OUTPUT SIGNAL LEVELS

[75] Inventor: Atusi Inahasi, Saitama, Japan

[73] Assignee: NEC Corporation, Tokyo, Japan

[21] Appl. No.: 08/877,619

[22] Filed: Jun. 18, 1997

[30] Foreign Application Priority Data

Jun. 18, 1996 [JP] Japan .................... 8-156710

[51] Int. Cl.[6] .................................................. H03G 3/30
[52] U.S. Cl. ........................ 330/134; 330/141; 330/181
[58] Field of Search ............................... 330/129, 134, 330/141, 279, 281; 455/126

[56] References Cited

U.S. PATENT DOCUMENTS 5,283,533  2/1994  Hori ................................. 330/279 X
5,678,209  10/1997 Strakovsky ........................... 455/126

FOREIGN PATENT DOCUMENTS 61-45614  5/1986  Japan ................................ 330/279

7-106881  4/1995  Japan .

OTHER PUBLICATIONS

Davis et al. "Registration Automatic Gain Circuits", IBM Technical Disclosure Bulletin, vol. 17, No.5, pp. 1363–1364, Oct. 1974.

Primary Examiner—James B. Mullins
Attorney, Agent, or Firm—Sughrue, Mion, Zinn, Macpeak & Seas, PLLC

[57] ABSTRACT

In an output signal level control circuit, a level adjusting section receives an input signal to adjust the input signal in level in response to a level control signal. A branching circuit branches a portion of the input signal adjusted in level by the level adjusting section to produce a branched signal. A detecting section includes the first and second detecting sections and generates a detection resultant signal based on a first detection result of the branched signal by the first detecting section and a second detection result of the branch signal by the second detecting section. The first and second detecting sections are operable at a same time. A control signal generating unit generates the level control signal based on the detection resultant signal to output to the level adjusting section.

19 Claims, 3 Drawing Sheets

5,898,337

OUTPUT SIGNAL LEVEL CONTROL CIRCUIT USING DIFFERENT DETECTING SECTIONS IN DIFFERENT OUTPUT SIGNAL LEVELS

BACKGROUND OF THE INVENTION

1. Field of the Invention

The present invention relates to an output signal level control circuit, and more particularly, to an output signal level control circuit for controlling an output level of an output signal with a wide dynamic range when the output signal level control circuit is applied to a cellular telephone system and so on.

2. Description of the Related Art

In a car telephone apparatus, the transmission output level of an output signal must be maintained. For this reason, the output level of the output signal is always monitored and controlled with high precision in a wide range. In general, when the output level of the output signal is controlled, a part of the output signal is branched and detected by a detector. A variable attenuation unit or an amplifier is controlled based on this detection result.

In this case, it is difficult to control the output level of the output signal with high precision in a wide range because of non-linearness and temperature change of the detection characteristic of the detector.

A conventional example of the output signal level control circuit which solves such a problem is disclosed in Japanese Laid Open Patent Disclosure (J-PA-Heisei 7-106881). According to this reference, the first and second level control circuits are provided to weight the detection outputs of detecting circuits on the low level side and the high level side, respectively. By appropriately switching between the first and second level control circuits by a switching circuit, the output level of the output signal can be controlled with stability and high precision.

However, in the above-mentioned conventional example of the output level control circuit, the first and second level control circuit need to be adaptive for the detection characteristics of the detecting circuit. For this reason, the adjustment of the inclination of the detection characteristic curve and the direct current offset quantity becomes complicated and took a long time.

Also, because it is necessary to provide the memory which previously stores the detection characteristic of the detecting circuit so that the circuit scale of the detecting circuit becomes large, there is a problem in low production cost and manufacture with a small size.

Further, in the output signal level control circuit which performs the weighting of the output signal on the low level side, because the level control is performed with a high gain to correct the low detection efficiency of the detecting circuit in the low level, it is necessary to perform temperature compensation to prevent an error due to temperature change.

SUMMARY OF THE INVENTION

The present invention is made in the light of the above-mentioned circumstances. An object of the present invention is to provide an output signal level control circuit which can be realize with a simple circuit structure.

Another object of the present invention is an output signal level control circuit in which a detection circuit can generate a detection output voltage such that an output level of an output signal can be controlled in a wide dynamic range.

Still another object of the present invention is provide an output signal level control circuit which can operate with an improved stability without any special temperature compensation circuit.

In order to achieve an aspect of the present invention, an output signal level control circuit includes a level adjusting section for receiving an input signal, and for adjusting the input signal in level in response to a level control signal, a branching circuit for branching a portion of the input signal adjusted in level by the level adjusting section to produce a branched signal, the remaining portion of the input signal adjusted in level being output as an output signal, a detecting section having first and second detecting sections, for generating a detection resultant signal based on a first detection result of the branched signal by the first detecting section a second detection result of the branch signal by the second detecting section, wherein the first and second detecting sections are operable at a same time, and a detection efficiency of the first detecting section is higher than that of the second detecting section, and a control signal generating unit for generating the level control signal based on the detection resultant signal to output to the level adjusting section.

The first and second detecting sections includes first and second diodes for detecting the branched signal, respectively, and a portion of a diode characteristic of the first diode which portion is used to detect the branched signal is more abrupt than a portion of a diode characteristic of the second diode which portion is used to detect the branched signal. The detecting section generates the detection resultant signal based on a difference in absolute value between the first detection result and the second detection result.

When the first and second detecting sections includes first and second diodes for detecting the branched signal, respectively, the branched signal is supplied to an anode of the first diode and an cathode of the second diode, an operational amplifier of the detecting section generates the detection resultant signal based on a summation of the first and second detection results. In this case, the anode of the first diode may be applied with a predetermined bias.

When the first and second detecting sections includes first and second diodes for detecting the branched signal, respectively, the branched signal is supplied to anodes of the first and second diodes, and a differential amplifier of the detecting section generates the detection resultant signal based on a difference of the first and second detection results. In this case, the anode of the first diode may be also applied with a predetermined bias.

In order to achieve another aspect of the present invention, an output signal level control circuit includes a level adjusting section for receiving an input signal, and for adjusting the input signal in level in response to a level control signal, a branching circuit for branching a portion of the input signal adjusted in level by the level adjusting section to produce a branched signal, the remaining portion of the input signal adjusted in level being output as an output signal, a detecting section having first and second detecting sections, for generating a detection resultant signal based on a difference in absolute value between a first detection result of the branched signal by the first detecting section a second detection result of the branch signal by the second detecting section, and a control signal generating unit for generating the level control signal based on the detection resultant signal to output to the level adjusting section.

In a case where the detecting section includes the first and second detecting sections, and a synthesizing section for generating the detection resultant signal based on a difference in absolute value between a first detection result of the branched signal by the first detecting section a second detection result of the branch signal by the second detecting section, when the first detecting section includes a first diode connected to the branched signal in a forward direction, and a first smoothing circuit having a first capacitor and a first resistor which are connected in parallel to a cathode of the first diode, and the second detecting section includes a second diode connected to the branched signal in a reverse direction, and a second smoothing circuit having a second capacitor and a second resistor which are connected in parallel to an anode of the second diode, the synthesizing section includes an operational amplifier for generating the detection resultant signal based on a summation of the first detection result and the second detection result.

In a case where the detecting section includes the first and second detecting sections, and a synthesizing section for generating the detection resultant signal based on a difference in absolute value between a first detection result of the branched signal by the first detecting section a second detection result of the branch signal by the second detecting section, when the first detecting section includes a first diode connected to the branched signal in a forward direction, and a first smoothing circuit having a first capacitor and a first resistor which are connected in parallel to a cathode of the first diode, and the second detecting section includes a second diode connected to the branched signal in a forward direction, and a second smoothing circuit having a second capacitor and a second resistor which are connected in parallel to an anode of the second diode, the synthesizing section includes a differential amplifier for generating the detection resultant signal based on a difference between the first detection result and the second detection result.

In this case, each of the first and second detecting sections includes a smoothing circuit having a resistor and a capacitor which are connected in parallel, and a time constant as a multiplication of the resistor and the capacitor is equal to each other in the first and second detecting sections. Also, in above cases, the first diode may be a schottky diode and the second diode may be a silicon diode.

In order to achieve still another aspect of the present invention, an output signal level control circuit includes a level adjusting section for receiving an input signal, and for adjusting the input signal in level in response to a level control signal, a branching circuit for branching a portion of the input signal adjusted in level by the level adjusting section to produce a branched signal, the remaining portion of the input signal adjusted in level being output as an output signal, a detecting section having first and second detecting sections, for generating a detection resultant signal based on a first detection result of the branched signal by the first detecting section a second detection result of the branch signal by the second detecting section, wherein the first detecting section is dominant to the detection resultant signal in a first region of the branched signal, the first and second detecting sections contribute to the detection resultant signal in a second region of the branched signal, and the second detecting section is dominant to the detection resultant signal in a third region of the branched signal, and a control signal generating unit for generating the level control signal based on the detection resultant signal to output to the level adjusting section.

DESCRIPTION OF THE PREFERRED EMBODIMENTS

Next, an output signal level control circuit of the present invention will be described below in detail with reference to the accompanying drawings.

Figure 1:
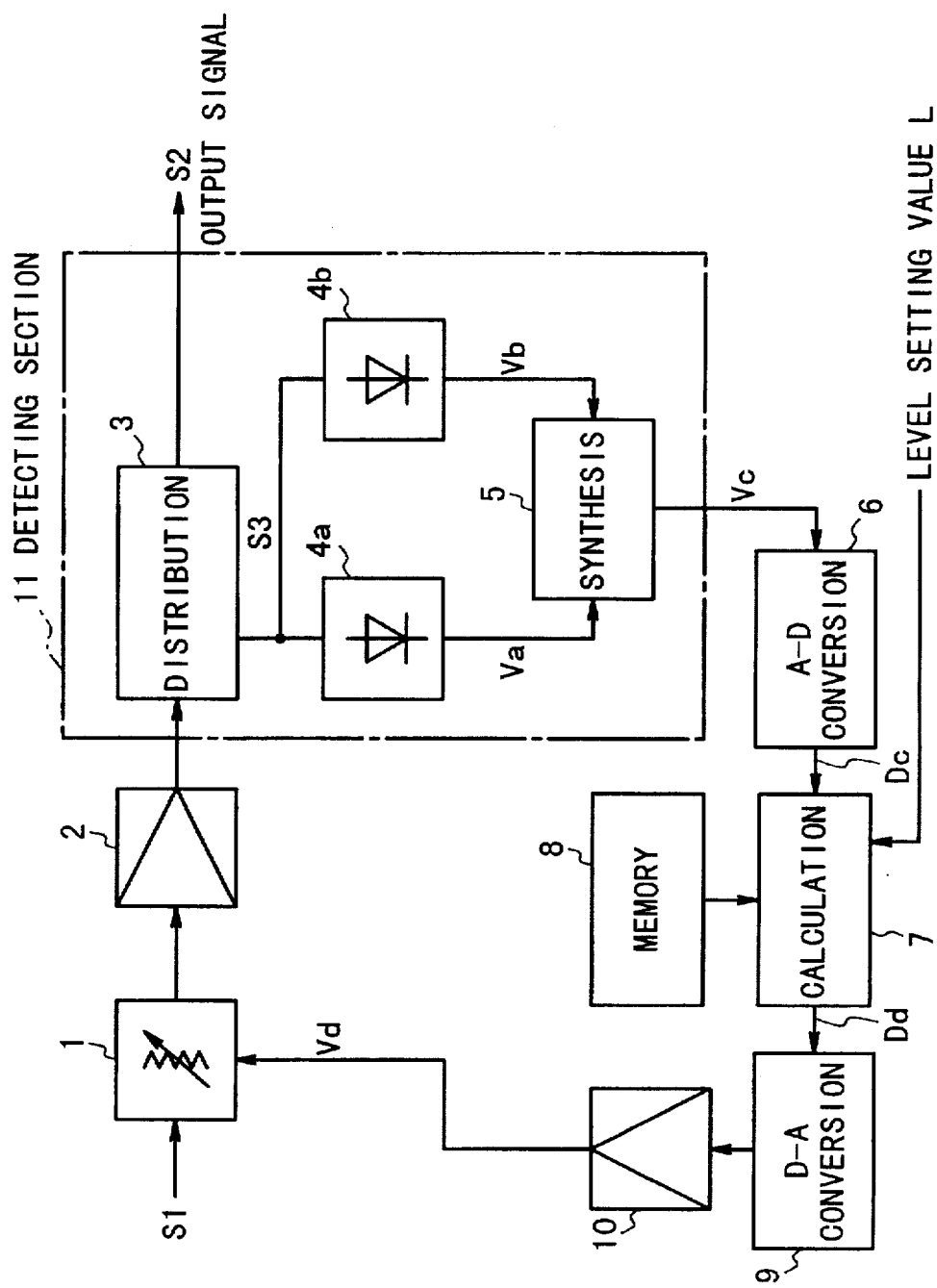
FIG. 1 is a block diagram illustrating an output signal level control circuit according to an embodiment of the present invention.

FIG. 1 is a block diagram illustrating an embodiment of the present invention. The output signal level control circuit is composed of a level adjusting section, a detecting section, and a control signal generating section. A high frequency input signal S1 is inputted to the level adjusting section and is adjusted in output level in response to a level control signal Vd. The level adjusted signal is outputted as an output signal S2. A part of the output signal S2 is branched at a constant ratio. The detecting section 11 detects the branched signal and generates a detection output voltage Vc indicative of the output level of the output signal S2. The control signal generating section generates the level control signal Vd based on this detection output voltage Vc so that the output level of output signal S2 is controlled to be a predetermined level.

More specifically, the level adjusting section is composed of a variable attenuating section 1 and an amplifier 2. The high frequency input signal S1 is inputted to the variable attenuating section 1 to be attenuated in response to the level control signal Vd and then amplified by the amplifier 2.

The detecting section 11 is composed of a distributing circuit 3, first and second detecting circuits 4a and 4b, and a detection voltage synthesizing circuit 5. The amplified signal from the amplifier 2 is almost sent out as the output signal S2 via a distributing circuit 3. The distributing circuit 3 branches a part of the amplified signal at a constant ratio and outputs to the first and second detecting circuits 4a and 4b as a branched signal S3. The first and second detecting circuits 4a and 4b detect the branched signal S3 independently and generate detection voltages Va and Vb. The detection voltage synthesizing circuit 5 synthesizes the detection voltages Va and Vb to generate the detection output voltage Vc. That is, the detection voltage synthesizing circuit 5 determines a difference in absolute value between the detection voltages Va and Vb to generate the detection output voltage Vc.

The control signal generating section is composed of an A-D converting circuit 6, a memory 8, a calculating circuit 7, a D-A converting circuit 9, and a buffer circuit 10. The A-D converting circuit 6 to convert the detection output voltage Vc into a digital data Dc indicative of the detection output voltage value Vc. A target detection output voltage value is previously stored in the memory 8 with respect to the output level of the output signal. In other words, a value of the detection output voltage Vc is previously measured with respect to the output level of output signal S2, and is stored in the memory 8 using the output level of the output signal as an address. The calculating circuit 7 receives an instruction on a level setting value L from an external unit to read the target detection output voltage value corresponding to this level setting value L from the memory 8, and calculates a difference between the read out target detection output voltage and the data Dc indicative of the detection output voltage VC to output the difference data Dd. The D-A converting circuit 9 converts the difference data Dd in an analog value and outputs it to the variable attenuating section 1 as a level control signal Vd through the buffer circuit 10.

In this manner, the variable attenuating circuit 1 attenuates the high frequency input signal S1 in response to the level control signal Vd and controls such that the value of the difference data Dd is converged to "0", that is, the output level of output signal S2 is made equal to the level setting value L.

Figure 2:
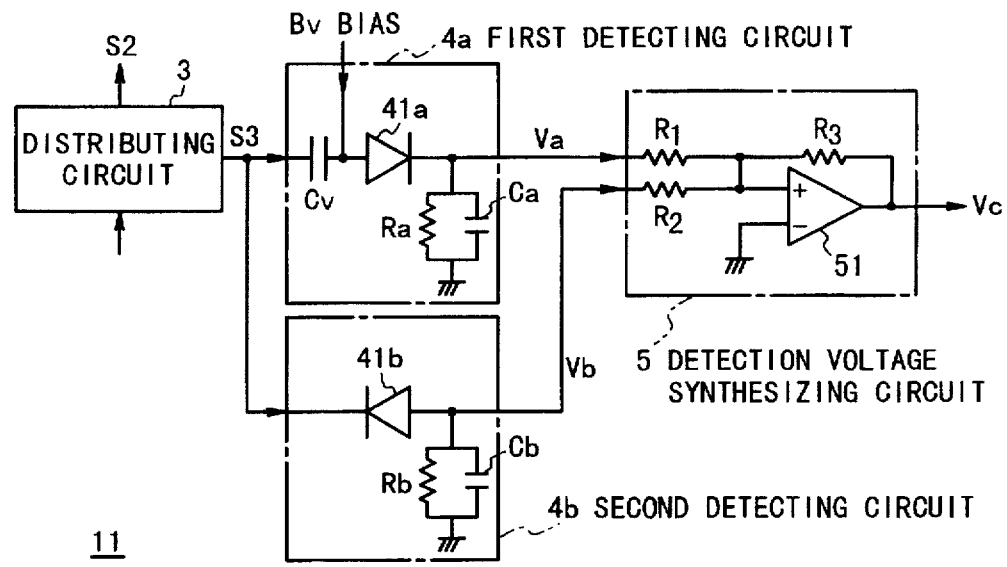
FIG. 2 is a circuit diagram illustrating an embodiment of a detecting section 11 shown in FIG. 1.

Next, the detection section 11 will be described in detail with reference to FIG. 2. FIG. 2 is a circuit diagram illustrating an embodiment of the detection section 11. The detecting section 11 is composed of a distributing circuit 3, the first and second detecting circuits 4a and 4b, and the detection voltage synthesizing circuit 5. The functions required to this detection section 11 are that the detection output voltage Vc can be obtained with a high precision in response to the change of the output level of the output signal S2 even in the low output level, and that the detection output voltage Vc is obtained to allow the output level control in a wide dynamic range within the power supply voltage Vs which is supplied to the output signal level control circuit.

As shown in FIG. 2, the first detecting circuit 4a is composed of a capacitor Cv, a first diode 41a and a first smoothing circuit in which a resistor Ra and a capacitor Ca are connected in parallel. The branched signal S3 by the distributing circuit 3 is supplied to the first diode 41a via the capacitor Cv in the forward direction. The first smoothing circuit is connected to the cathode of the first diode 41a. The second detecting circuits 4b is composed of a second diode 41b and a second smoothing circuit in which a resistor Rb and a capacitor Cb are connected in parallel. The branched signal S3 by the distributing circuit 3 is supplied to the second diode 41b directly in the reverse direction. The second smoothing circuit is connected to the anode of the first diode 41b. The first and second diodes 41a and 41b detect the signal S3 distributed by the distributing circuit 3 to outputs detection voltages Va and Vb, respectively. The detection voltage synthesizing section 5 synthesizes the detection voltages Va and Vb to send out as the detection output voltage Vc.

The diode 41a of the first detecting circuit 4a and the diode 41b of the second detecting circuit 4b are provided in the opposite directions, as described above. Therefore, because the first smoothing circuit is provided on the side of the cathode of the first diode 41a, the positive detection voltage Va is generated in the both edges of the first smoothing circuit. Also, because the second smoothing circuit is provided on the side of the anode of the second diode 41b in the second detection circuit 4b, the negative detection voltage Vb is generated in the both edges of the second smoothing circuit.

The detection voltage synthesizing section 5 calculates a difference in absolute value between the detection voltages Va and Vb to output as the detection output voltage Vc. In this case, because the detection voltages Va and Vb have opposite polarities to each other, there is outputted the summation of the detection voltages Va (the positive voltage) and Vb (the negative voltage) as the detection output voltage Vc. Thus, an operational amplifier 51 is used to carry out an addition operation, Vc=Va+(-Vb)=Va-Vb when R1=R2=R3 in FIG. 2.

Generally, the detection efficiency in a low level is low due to the detection characteristic of the diode. For this reason, a forward direction bias Bv is applied to the first diode 41a of the first detecting circuit 4a such that the first diode 41a is set to the conductive state. As a result, the detection efficiency in the low level can be improved. The detection characteristic, i.e., the output level of the output signal vs. the detection voltage in the first detecting circuit 4a before the bias application is shown by the curve E in FIG. 4, whereas, the detection characteristic can be changed into the curve A in FIG. 4 by applying the forward direction bias Bv to the first diode 41a. Therefore, the detection efficiency can be improved in the low level.

On the other hand, no bias is applied to the second diode 41b of the second detecting circuit 4b. Because the detection voltage Vb of the second smoothing circuit is negative voltage, the detection characteristic of the second detecting circuit 4b is shown by the curve F which is symmetrical to the curve E with respect to the lateral axis. Therefore, when the output level of the output signal S2 is as low as the range of 0 to P1, the first detecting circuit 4a mainly operates to output the detection voltage Va. When the output level of the output signal S2 exceeds P1, the first and second detecting circuits 4a and 4b output the detection voltage Va and Vb, respectively.

By the way, in the relation of the detection voltages Va and Vb in the high level, although the forward direction bias is applied to the diode 41a, the detection output voltage Vc does not always vary monotonously in accordance with the output level, because the characteristics of the diodes 41a and 41b are different from each other and change due to temperature. In order to eliminate such an indefinite relation, it is necessary that the inclination of the detection characteristic of the first detecting circuit 4a is larger than that of the detection characteristic of the second detecting circuit 4b, in other words, that the detection efficiency of the first detecting circuit 4a is always higher than that of the second detecting circuit 4b.

Figure 4:
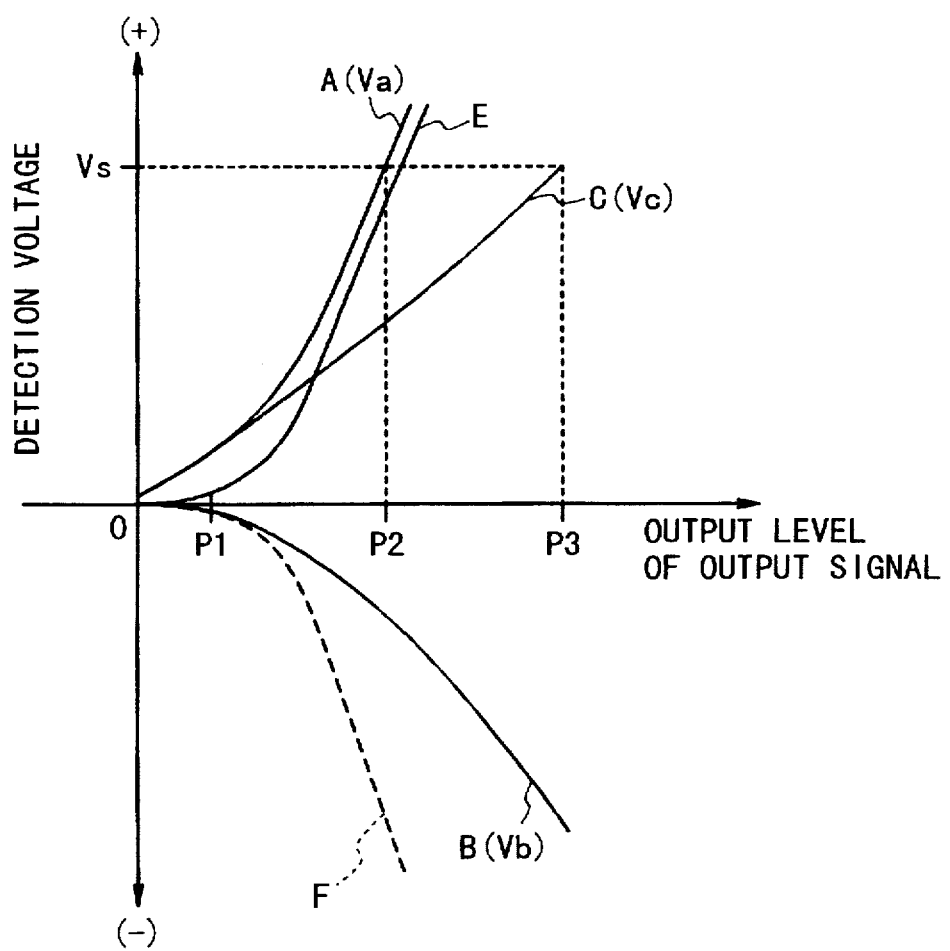
FIG. 4 is a diagram illustrating various detection voltages in the detecting section shown in FIG. 1

For example, if the values of the resistors Ra and Rb of the first and second smoothing circuits of the first and second detecting sections 4a and 4b are set to satisfy the relation of Ra>Rb, the detection characteristic of the second detecting circuit 4b changes from the curve F to curve B in FIG. 4. The total detection characteristic of the detection section 11 including the detection voltage synthesizing section 5 is expressed by the curve C obtained by synthesizing the curve A and the curve B.

In the curve C of FIG. 4, the detection voltage Va of the first detecting circuit 4a is dominant in the output signal level in a range of 0 to P1. Even if the detection voltage Va of the first detecting circuit 4a exceeds the power supply voltage Vs at the output signal level of P2, the detection output voltage Vc never exceeds the power supply voltage Vs until the output signal level reaches P3, because the detection voltage Vb is negative. That is, the values of the resistors Ra and Rb are set in such a manner that the detection output voltage Vc is equal to the power supply voltage Vs when the output level is the maximum of P3. Thereby, the output level can be controlled in a wide range within the supplied power supply voltage S.

Note that because the diodes used in actual are different from each other in characteristic, variable resistors are desirably used as the resistors Ra and Rb of the smoothing circuits of the detecting circuits 4a and 4b such that fine adjustment can be performed. Also, the bias Bv applied to the first detecting circuit 4a, is made variable. Further, it is desirable that the time constants Ra×Ca and Rb×Cb of the smoothing circuits are equal to each other.

Now, if it is assumed that the detection characteristic, i.e., the relation of the output level P and the detection voltages Va and Vb in the first and second detecting circuit 4a and 4b can be approximated in a cubic equation, the detection voltage Va of the first detecting circuit 4a and the detection voltage Vb of the second detecting circuit 4b can be expressed as follows.

$$Va = \alpha P^3 \quad (1)$$

$$Vb = -k(P-\beta)^3 \quad (2)$$

where α and k are constant values satisfying of α≦1 and k≦1, and β is a parameter which is related with the bias. Therefore, the detection output voltage Vc of the synthesizing section 5 can be expressed below.

$$Vc = \alpha P^3 - k(P-\beta)^3 \quad (3)$$

In the above equation (3), because the 3rd power terms can be canceled by choosing α and k, the detection characteristic can be brought close to a quadratic equation. Also, the circuit structure of the calculating circuit 7 and the memory section 8 can be simplified.

Also, because the change of the detection characteristic of the first and second detecting circuits 4a and 4b due to temperature can be canceled through the subtraction processing of the detection voltages Va and Vb. Therefore, the temperature compensation is not necessity.

Figure 3:
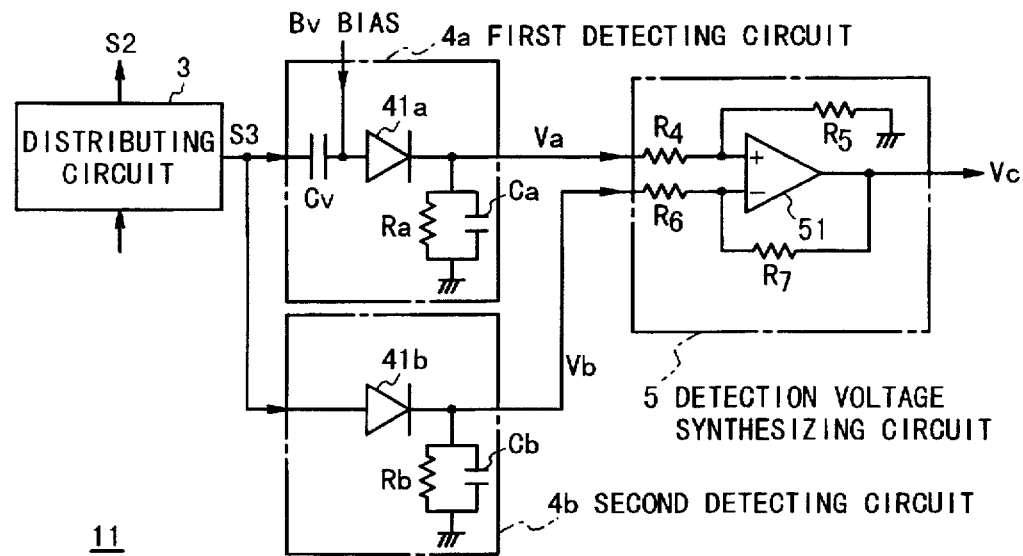
FIG. 3 is a circuit diagram illustrating another embodiment of the detecting section shown in FIG. 1.

FIG. 3 is a circuit diagram illustrating another embodiment of the detection section 11.

In this example, the first and second diodes 41a and 41b of the first and second detecting sections 4a and 4b are connected in the same direction to output the detection voltages Va and Vb of the same polarity (the positive voltage), respectively. Also, the detection voltage synthesizing section 5 performs the subtraction processing of the detection voltage Vb (the positive voltage) from the detection voltage Va (the positive voltage). That is, the detection voltage synthesizing section 5 performs differential amplification using an operational amplifier 51 to output Vc=Va−Vb when R4=R5=R6=R7. It could be understood that the detection section 11 in FIG. 3 can operate in the same manner as the detecting section 11 shown in FIG. 2, so that the same effect can be obtained, even if the first and second detecting circuits are structured in this way.

In the second embodiment, a Schottky diode which has high detection efficiency in the low level may be used as the first diode 41a of the first detecting circuit 4a. Also, a silicon diode which has low detection efficiency in the low level may be used as the diode 4b of the second detecting section 41b.

As described above, according to the present invention, the first and second detecting circuits which detect output levels are provided such that the detection efficiency of the first detecting circuit is always higher than that of the second detecting circuit.

Also, a difference in absolute value between the first and second detection voltages Va and Vb is calculated and outputted as the detection output voltage Vc. The output level of the output signal S2 is controlled based on this detection output voltage Vc so that the first detecting circuit 41a can detect the output level with high precision in the low level and the output level range can be widened in the high level until the detection output voltage Vc reaches the power supply voltage Vs.

Further, because the influence due to temperature change and noise can be canceled, the output level control can be realized in a wide dynamic range with the simple circuit structure and with improved stability in low level output.

What is claimed is:

1. An output signal level control circuit comprising:

a level adjusting section for receiving an input signal, and for adjusting the input signal in level in response to a level control signal;

a branching circuit for branching a portion of the input signal adjusted in level by said level adjusting section to produce a branched signal, the remaining portion of the input signal adjusted in level being output as an output signal;

a detecting section having first and second detecting sections, for generating a detection resultant signal based on a first detection result of the branched signal by said first detecting section and a second detection result of the branch signal by said second detecting section, wherein said first and second detecting sections are operable at a same time, and a detection efficiency of said first detecting section is greater than that of said second detecting section; and a control signal generating unit for generating the level control signal based on said detection resultant signal to output to said level adjusting section.

2. An output signal level control circuit according to claim 1, wherein said first and second detecting sections includes first and second diodes for detecting the branched signal, respectively, and wherein a portion of a diode characteristic of said first diode which portion is used to detect the branched signal is more abrupt than a portion of a diode characteristic of said second diode which portion is used to detect the branched signal.

3. An output signal level control circuit according to claim 1, wherein said detecting section generates said detection resultant signal based on a difference in absolute value between said first detection result and said second detection result.

4. An output signal level control circuit according to claim 3, wherein said first and second detecting sections includes first and second diodes for detecting the branched signal, respectively, and wherein the branched signal is supplied to an anode of said first diode and an cathode of said second diode, and wherein said detecting section further includes an operational amplifier for generating said detection resultant signal based on a summation of said first and second detection results.

5. An output signal level control circuit according to claim 4, wherein the anode of said first diode is applied with a predetermined bias.

6. An output signal level control circuit comprising:

a level adjusting section for receiving an input signal, and for adjusting the input signal in level in response to a level control signal;

a branching circuit for branching a portion of the input signal adjusted in level by said level adjusting section to produce a branched signal the remaining portion of the input signal adjusted in level being output as an output signal;

a detecting section having first and second detecting sections, for generating a detection resultant signal based on a first detection result of the branched signal by said first detecting section and a second detection result of the branch signal by said second detecting section, wherein said first and second detecting sections are operable at a same time, and a detection efficiency of said first detecting section is greater than that of said second detecting section; and a control signal generating unit for generating the level control signal based on said detection resultant signal to output to said level adjusting section, wherein said detecting section generates said detection resultant signal based on a difference in absolute value between said first detection result and said second detection result and, wherein said first and second detecting sections includes first and second diodes for detecting the branched signal, respectively, and wherein the branched signal is supplied to anodes of said first and second diodes, and wherein said detecting section further includes a differential amplifier for generating said detection resultant signal based on a difference of said first and second detection results.

7. An output signal level control circuit according to claim 6, wherein the anode of said first diode is applied with a predetermined bias.

8. An output signal level control circuit comprising:

a level adjusting section for receiving an input signal, and for adjusting the input signal in level in response to a level control signal;

a branching circuit for branching a portion of the input signal adjusted in level by said level adjusting section to produce a branched signal, the remaining portion of the input signal adjusted in level being output as an output signal;

a detecting section having first and second detecting sections, for generating a detection resultant signal based on a difference in absolute value between a first detection result of the branched signal by said first detecting section a second detection result of the branch signal by said second detecting section; and a control signal generating unit for generating the level control signal based on said detection resultant signal to output to said level adjusting section, wherein said first detecting section includes a diode, said diode being forward biased; and a capacitor connected in series between an anode of said diode and said branched signal.

9. An output signal level control circuit according to claim 8, wherein said detecting section includes said first and second detecting sections; and a synthesizing section for generating the detection resultant signal based on a difference in absolute value between a first detection result of the branched signal by said first detecting section a second detection result of the branch signal by said second detecting section, and wherein said first detecting section includes a first diode connected to the branched signal in a forward direction; and a first smoothing circuit having a first capacitor and a first resistor which are connected in parallel to a cathode of said first diode, and wherein said second detecting section includes:

a second diode connected to the branched signal in a reverse direction; and a second smoothing circuit having a second capacitor and a second resistor which are connected in parallel to a cathode of said second diode, and wherein said synthesizing section includes:

an operational resultant signal based on a summation of said first detection result and said second detection result.

10. An output signal level control circuit according to claim 9, wherein the anode of said first diode is applied with a predetermined bias.

11. An output signal level control circuit according to claim 10, wherein said first diode is a schottky diode and said second diode is a silicon diode.

12. An output signal level control circuit comprising:

a level adjusting section for receiving an input signal and for adjusting the input signal in level in response to a level control signal; a branching circuit for branching a portion of the input signal adjusted in level by said level adjusting section to produce a branched signal, the remaining portion of the input signal adjusted in level being output as an output signal;

a detecting section having first and second detecting sections, for generating a detection resultant signal based on a difference in absolute value between a first detection result of the branched signal by said first detecting section of second detection result of the branch signal by said second detecting section; and a control signal generating unit for generating the level control signal based on said detection resultant signal to output to said level adjusting section, wherein said detecting section includes said first and second detecting sections; and a synthesizing section for generating the detection resultant signal based on a difference in absolute value between a first detection result of the branched signal by said first detecting section a second detection result of the branch signal by said second detecting section, and wherein said first detecting section includes:

a first diode connected to the branched signal in a forward direction; and a first smoothing circuit having a first capacitor and a first resistor which are connected in parallel to a cathode of said first diode, and wherein said second detecting section includes:

a second diode connected to the branched signal in a reverse direction; and a second smoothing circuit having a second capacitor and a second resistor which are connected in parallel to an anode of said second diode, and wherein said synthesizing section includes:

an operational resultant signal based on a summation of said first detection result and said second detection result.

13. An output signal level control circuit according to claim 12, wherein the anode of said first diode is applied with a predetermined bias.

14. An output signal level control circuit according to claim 12, wherein each of said first and second detecting sections includes a smoothing circuit and a time constant as a multiplication of the resistor and the capacitor is equal to each other in said first and second detecting sections.

15. An output signal level control circuit according to claim 14, wherein a resistance of said resistor in said first detecting section is larger than that of said resistor in said second detecting section.

16. An output signal level control circuit comprising:

a level adjusting section for receiving an input signal, and for adjusting the input signal in level in response to a level control signal; a branching circuit for branching a portion of the input signal adjusted in level by said level adjusting section to produce a branched signal, the remaining portion of the input signal adjusted in level being output as an output signal;

a detecting section having first and second detecting sections, for generating a detection resultant signal based on a first detection result of the branched signal by said first detecting section a second detection result of the branch signal by said second detecting section, wherein said first detecting section is dominant to said detection result signal in a first region of the branched signal, and said first and second detecting sections contribute to said detection resultant signal in a second region of the branched signal; and a control signal generating unit for generating the level control signal based on said detection resultant signal to output to said level adjusting section, wherein said first and second detecting sections include first and second diodes, respectively, for detecting the branched signal and wherein a diode characteristic of said first diode is more abrupt than that of said second diode in the first region.

17. An output signal level control circuit according to claim 16, wherein said detecting section includes a synthesizing section for synthesizing said first and second detection results to generate a difference in absolute value between said first and second detection results.

18. An output signal level control circuit according to claim 17, wherein said first and second detecting sections includes said first and second diodes provided in a same direction for the branched signal, respectively.

19. An output signal level control circuit according to claim 17, wherein said first and second detecting sections includes said first and second diodes provided in an opposite direction for the branched signal, respectively.

* * * * *